(12) United States Patent
Chiang et al.

(10) Patent No.: US 9,791,753 B2
(45) Date of Patent: Oct. 17, 2017

(54) CIRCUIT SUBSTRATE STRUCTURE AND METHOD FOR MANUFACTURING THEREOF

(71) Applicant: E Ink Holdings Inc., Hsinchu (TW)

(72) Inventors: Ming-Sheng Chiang, Hsinchu (TW); Chi-Ming Wu, Hsinchu (TW); Chen-Yuan Sung, Hsinchu (TW); Chen-Lung Lo, Hsinchu (TW); Ta-Nien Luan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 72 days.

(21) Appl. No.: 14/144,599

(22) Filed: Dec. 31, 2013

(65) Prior Publication Data
US 2014/0192491 A1    Jul. 10, 2014

(30) Foreign Application Priority Data
Jan. 10, 2013  (TW) .............. 102100947 A

(51) Int. Cl.
*G02F 1/1345* (2006.01)
*H05K 3/28* (2006.01)
(Continued)

(52) U.S. Cl.
CPC ........... *G02F 1/13454* (2013.01); *H05K 3/28* (2013.01); *H05K 3/32* (2013.01); *G02F 1/13452* (2013.01);
(Continued)

(58) Field of Classification Search
CPC ............. H01L 2224/50; H01L 2224/79; H01L 2224/86; H01L 2225/06579; H01L 2225/107; H01L 24/50; G09G 2290/00
See application file for complete search history.

(56) References Cited

U.S. PATENT DOCUMENTS

| 4,826,297 A | 5/1989 | Kubo et al. |
| 4,917,466 A * | 4/1990 | Nakamura et al. ........... 349/151 |

(Continued)

FOREIGN PATENT DOCUMENTS

| CN | 100369532 C | 2/2008 |
| EP | 0562388 A1 | 9/1993 |

(Continued)

OTHER PUBLICATIONS

Corresponding Taiwanese Office Action that these art references were cited.

(Continued)

*Primary Examiner* — Edward Glick
*Assistant Examiner* — Shan Liu
(74) *Attorney, Agent, or Firm* — CKC & Partners Co., Ltd.

(57) ABSTRACT

The invention provides a circuit substrate structure and a method for manufacturing thereof. The circuit substrate structure includes a substrate, a pixel array layer, a display unit, a peripheral circuit layer, at least one integrated circuit chip, a flexible printed circuit board, at least one flattening material layer and a passivation layer. In the circuit substrate structure, the flattening material layer is positioned on the peripheral circuit layer, and possesses at least one opening corresponded to and around the integrated circuit chip. By positioning the flattening material layer, the circuit substrate structure possesses a flat surface, and prevents producing air bubbles, so as to enhance the reliability of the display device.

12 Claims, 6 Drawing Sheets

(51) Int. Cl.
*H05K 3/32* (2006.01)
*H05K 3/36* (2006.01)

(52) U.S. Cl.
CPC ............ *H05K 3/281* (2013.01); *H05K 3/284* (2013.01); *H05K 3/361* (2013.01); *H05K 2201/10128* (2013.01); *H05K 2203/063* (2013.01); *Y10T 29/4913* (2015.01)

(56) References Cited

U.S. PATENT DOCUMENTS

| | | | |
|---|---|---|---|
| 5,193,022 A | 3/1993 | Hirai | |
| 5,923,393 A * | 7/1999 | Chang | G02F 1/13452 257/E23.004 |
| 6,151,091 A * | 11/2000 | Muramatsu | G02F 1/1345 349/149 |
| 6,333,603 B1 | 12/2001 | Juang et al. | |
| 6,424,400 B1 * | 7/2002 | Kawasaki | G02F 1/13452 349/149 |
| 6,438,826 B2 | 8/2002 | Takase et al. | |
| 6,556,268 B1 | 4/2003 | Lee et al. | |
| 6,567,147 B1 * | 5/2003 | Hirakata | G02F 1/133345 349/153 |
| 6,703,702 B2 * | 3/2004 | Inoue | H01L 23/36 257/584 |
| 6,774,971 B2 | 8/2004 | Shirato et al. | |
| 6,841,419 B2 * | 1/2005 | Akita et al. | 438/118 |
| 6,980,275 B1 * | 12/2005 | Konuma | G02F 1/1339 349/151 |
| 7,023,518 B1 | 4/2006 | Koyama et al. | |
| 7,791,704 B2 | 9/2010 | Abe | |
| 7,796,214 B2 | 9/2010 | Tsai et al. | |
| 7,817,232 B2 * | 10/2010 | Zhang | G02F 1/133 349/106 |
| 7,956,537 B2 | 6/2011 | Nakadaira | |
| 8,000,091 B2 | 8/2011 | Shinn et al. | |
| 8,004,620 B2 | 8/2011 | Ishii et al. | |
| 8,111,367 B2 | 2/2012 | Ueda et al. | |
| 8,198,630 B2 | 6/2012 | Yamazaki et al. | |
| 8,269,940 B2 | 9/2012 | Kuo et al. | |
| 8,274,633 B2 | 9/2012 | Ino | |
| 8,569,749 B2 * | 10/2013 | Kim | 257/40 |
| 2001/0044170 A1 * | 11/2001 | Muramatsu | H01L 21/56 438/124 |
| 2002/0015005 A1 * | 2/2002 | Imaeda | G02F 1/13452 345/5 |
| 2003/0020152 A1 * | 1/2003 | Inoue | H01L 23/36 257/684 |
| 2003/0184704 A1 * | 10/2003 | Akiyama et al. | 349/158 |
| 2006/0126313 A1 | 6/2006 | Steiner et al. | |
| 2007/0013822 A1 | 1/2007 | Kawata et al. | |
| 2008/0013030 A1 * | 1/2008 | Fujita | G02F 1/133305 349/151 |
| 2009/0115942 A1 * | 5/2009 | Watanabe | G02F 1/133305 349/96 |
| 2009/0184919 A1 * | 7/2009 | Shinn et al. | 345/107 |
| 2009/0213534 A1 * | 8/2009 | Sakai | G02F 1/13452 361/679.21 |
| 2010/0117531 A1 | 5/2010 | Park et al. | |
| 2010/0156857 A1 * | 6/2010 | Nozaki | G02F 1/13452 345/204 |
| 2010/0225875 A1 * | 9/2010 | Wang et al. | 349/160 |
| 2011/0267320 A1 * | 11/2011 | Hu | G02F 1/13452 345/204 |
| 2011/0290414 A1 * | 12/2011 | Wang | G02F 1/167 156/247 |
| 2012/0120364 A1 | 5/2012 | Wu | |
| 2012/0139884 A1 | 6/2012 | Lee et al. | |
| 2012/0175769 A1 | 7/2012 | Pendse | |
| 2013/0135830 A1 * | 5/2013 | Lai | H05K 7/06 361/749 |
| 2013/0153270 A1 * | 6/2013 | Hung et al. | 174/254 |
| 2014/0063433 A1 * | 3/2014 | Benson | G02F 1/1341 349/155 |
| 2015/0153594 A1 * | 6/2015 | Sato | G02F 1/13452 349/122 |

FOREIGN PATENT DOCUMENTS

| | | |
|---|---|---|
| TW | I300320 | 8/2008 |
| TW | 200933277 A | 8/2009 |
| TW | 200935277 A | 8/2009 |
| TW | I349221 | 9/2011 |
| WO | 2008096197 A1 | 8/2008 |

OTHER PUBLICATIONS

Corresponding Chinese Office Action that these art references dated May 5, 2016.

* cited by examiner

CIRCUIT SUBSTRATE STRUCTURE AND METHOD FOR MANUFACTURING THEREOF

RELATED APPLICATIONS

This application claims priority to Taiwanese Application Serial Number 102100947 filed Jan. 10, 2013, which is herein incorporated by reference.

BACKGROUND

Technical Field

The present disclosure relates to a circuit substrate structure, and more particularly, to a circuit substrate structure having a flattening material layer.

Description of Related Art

FIG. 1 is a sectional view of a traditional circuit substrate structure 100, which includes a substrate 110, a pixel array layer 120, a display unit 130 an integrated circuit chip 140, a flexible printed circuit board 150, a passivation layer 160 and a sealant 170.

In FIG. 1, the pixel array layer 120 is positioned on the substrate 110, and has a display area (not shown) and a non-display area (not shown). The display area 130 is positioned on the display area of the pixel array layer 120. The integrated circuit chip 140 and the flexible printed circuit board 150 are positioned on the non-display area of the pixel array layer 120, and electrically connected to each other through the pixel array layer 120. The passivation layer 160 covers the display unit 130. Then the sealant 170 is infiltrated by capillary action into the space between the passivation layer 160 and the pixel array layer 120, and cured by heating.

However, in a traditional display device, the sealant 170 is originally in liquid form without a fixed shape, so that the surface of the non-display area of the display area is not even. Besides, since the structure of the traditional display device has a difference in height forming several blind angles, the sealant 170 fails to uniformly infiltrate thereinto and thus generate several bubbles 180. The bubbles 180, after the heat-curing step of the sealant 170, are expanded to lift off the passivation layer 160 and the display unit 130, so as to deteriorate the reliability of the display device. Therefore, there is a need for an improved circuit substrate structure and a method of manufacturing the same, so as to solve the problems met in the art.

SUMMARY

The present disclosure provides a circuit substrate structure having a flattening material layer and a method for manufacturing thereof, so as to solve the problems of the prior art and achieve the purpose of flattening the display device.

One embodiment of the present disclosure is to provide a circuit substrate structure. The circuit substrate structure comprises a substrate, a pixel array layer, a display unit, a peripheral circuit layer, at least one integrated circuit chip, a flexible printed circuit board, at least on flattening material layer and a passivation layer. The substrate has a display area and a non-display area. The pixel array layer is positioned on the display area of the substrate. The display unit is positioned on the pixel array layer. The peripheral circuit layer is positioned on the non-display area of the substrate, and electrically connected to the pixel array layer. The integrated circuit chip is positioned on the peripheral circuit layer, and electrically connected to the pixel array layer. The flexible printed circuit board is positioned on the peripheral circuit layer, and electrically connected to the integrated circuit chip, the pixel array layer or the combinations thereof. The flattening material layer is positioned on the peripheral circuit layer, and covers a portion of the flexible printed circuit board. Wherein the flattening material layer has at least one opening which corresponds to and surrounds the integrated circuit chip. The passivation layer is positioned on and covers the display unit and the flattening material layer.

Another embodiment of the present disclosure is to provide a method for manufacturing the circuit substrate structure. The method for manufacturing the circuit substrate structure comprises providing a substrate having a display area and a non-display area, forming a pixel array layer on the display area of the substrate, forming a display unit on the pixel array layer, forming a peripheral circuit layer, on the non-display area of the substrate, forming at least one integrated circuit chip, on the peripheral circuit layer, forming a flexible printed circuit board on the peripheral circuit board, forming at least one flattening material layer on the peripheral circuit layer, and forming a passivation layer on the display unit and the flattening material layer. In which, the peripheral circuit layer is electrically connected to the pixel array layer. The integrated circuit chip is electrically connected to the pixel array layer. The flexible printed circuit board is electrically connected to the integrated circuit chip, the pixel array layer or the combinations thereof. The flattening material layer covers a portion of the flexible printed circuit board, and has at least one opening corresponding to and surrounding the integrated circuit chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
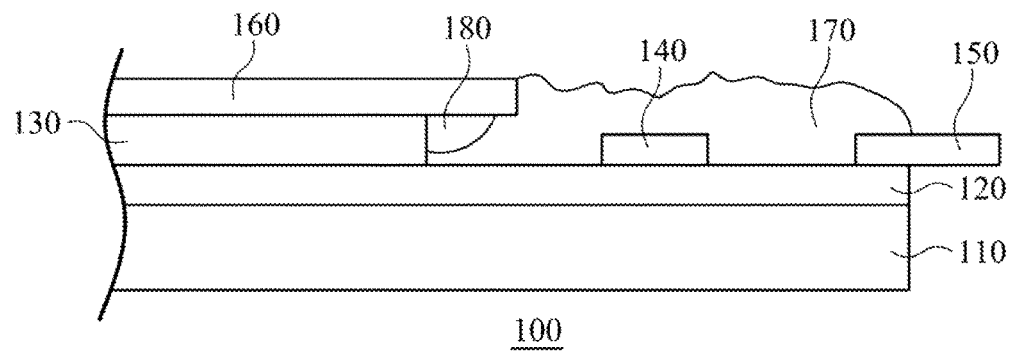
FIG. 1 is a sectional view of a traditional circuit substrate structure 100.

The embodiments of the circuit substrate structure and the method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

Figure 2A:
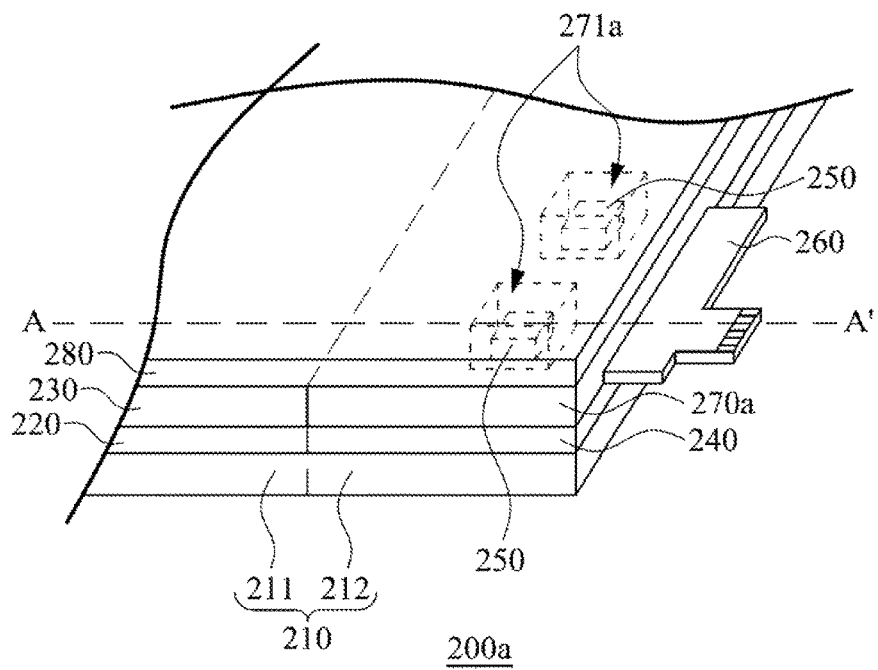
FIG. 2A is a three dimensional view of a circuit substrate structure 200a according to one embodiment of the present disclosure.
Figure 2B:
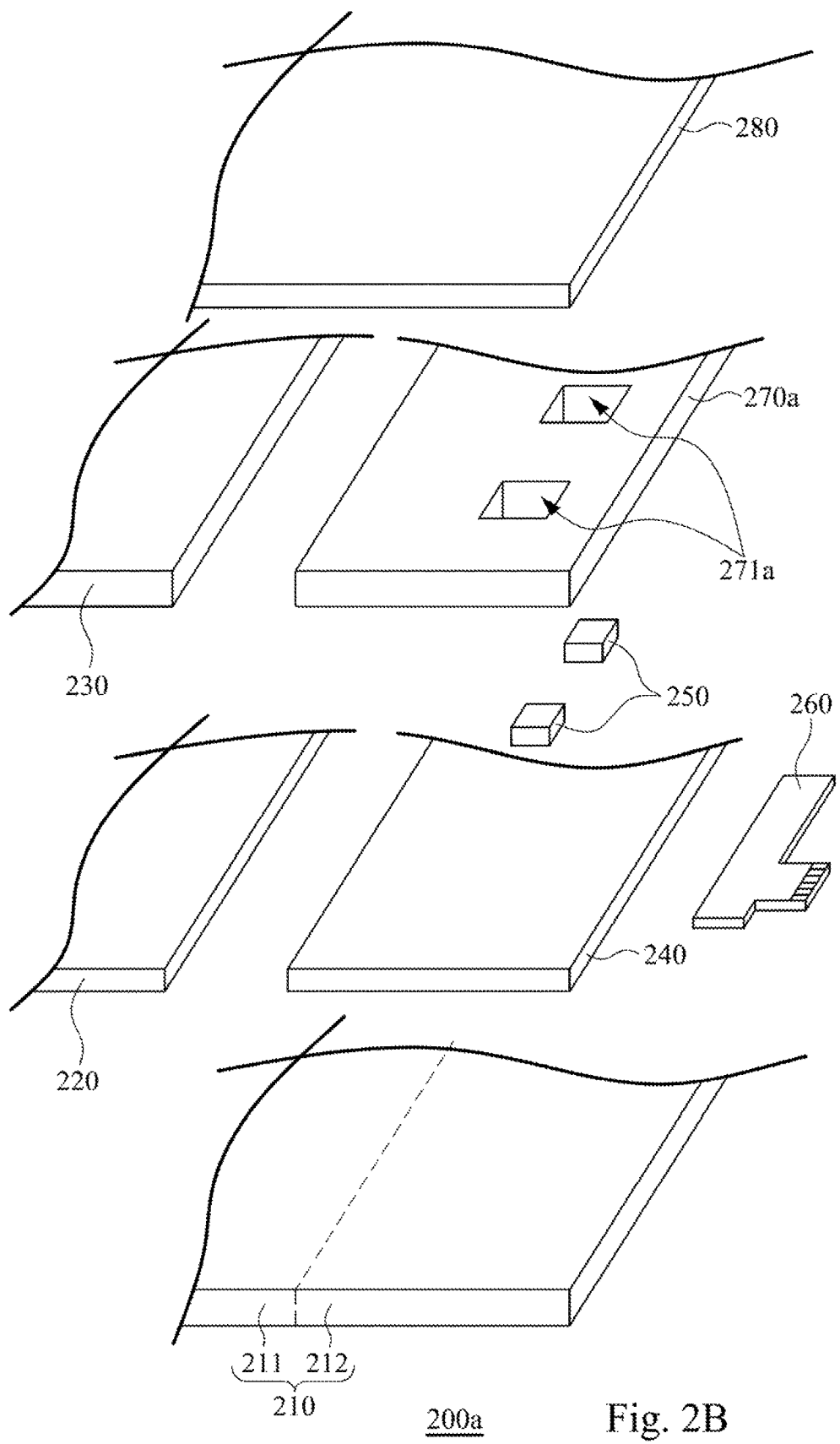
FIG. 2B is an exploded view of the circuit substrate structure 200a of FIG. 2A.

FIG. 2A is a three dimensional view of a circuit substrate structure 200a according to an embodiment of the present disclosure, and FIG. 2B is an exploded view of the circuit substrate structure 200a of FIG. 2A. The circuit substrate structure 200a comprises a substrate 210, a pixel array layer 220, a display unit 230, a peripheral circuit layer 240, at least one integrated circuit chip 250, a flexible printed circuit board 260, at least one flattening material layer 270a and a passivation layer 280.

In FIGS. 2A and 2B, the substrate 210 has a display area 211 and a non-display area 212. And the pixel array layer 220 and the display unit 230 is positioned sequentially on the display area 211 of the substrate 210. According to one example of the present disclosure, the material of the substrate 210 comprises glass, hard plastics or flexible plastics. According to one example of the present disclosure, the pixel array layer 220 comprises a thin-film transistor layer. According to one example of the present disclosure, the display unit 230 comprises a front panel, a liquid crystal display medium layer, or a light-emitting diode display medium layer. The front panel includes an E-paper medium layer, such as electrophoretic display medium layer.

The peripheral circuit layer 240 is positioned on the non-display area 212 of the substrate 210, and electrically connected to the pixel array layer 220. The integrated circuit chip 250, the flexible printed circuit board 260 and the flattening material layer 270a are positioned on the peripheral circuit layer 240. According to one example of the present disclosure, the peripheral circuit layer 240 comprises a thin-film transistor layer or a conductive circuit layer. According to one example of the present disclosure, the integrated circuit chip 250 comprises a driving circuit chip.

The flattening material layer 270a covers a portion of the flexible printed circuit board 260, and has at least one opening 271a. Each opening 271a corresponds to and surrounds the integrated circuit chip 250. Then, the passivation layer 280 is positioned on and covers the display unit 230 and the flattening material layer 270a. According to one example of the present disclosure, the material of the passivation layer 280 comprises flexible plastics.

Figure 2C:
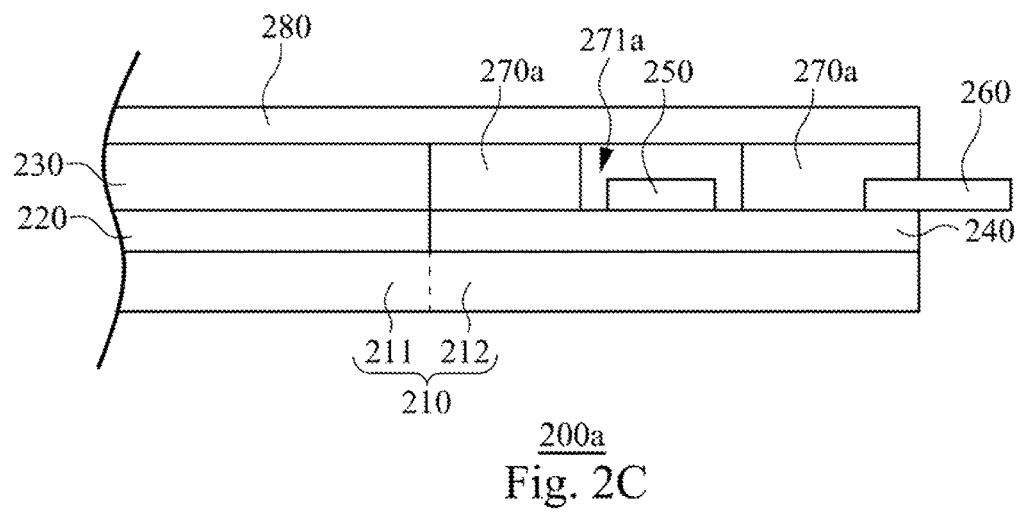
FIG. 2C is a sectional view of the circuit substrate structure 200a taken along the line A-A' of FIG. 2A.

FIG. 2C is a sectional view of the circuit substrate structure 200a taken along the line A-A' of FIG. 2A. In FIG. 2C, the flattening material layer 270a is positioned on the peripheral circuit layer 250, and the integrated circuit chip 250 is in the opening 271a. Besides, the flattening material layer 270a is contacted tightly with the neighboring display unit 230, and the passivation layer 280 can directly cover the flattening material layer 270a and the display unit 230 without filling a sealant.

Figure 2D:
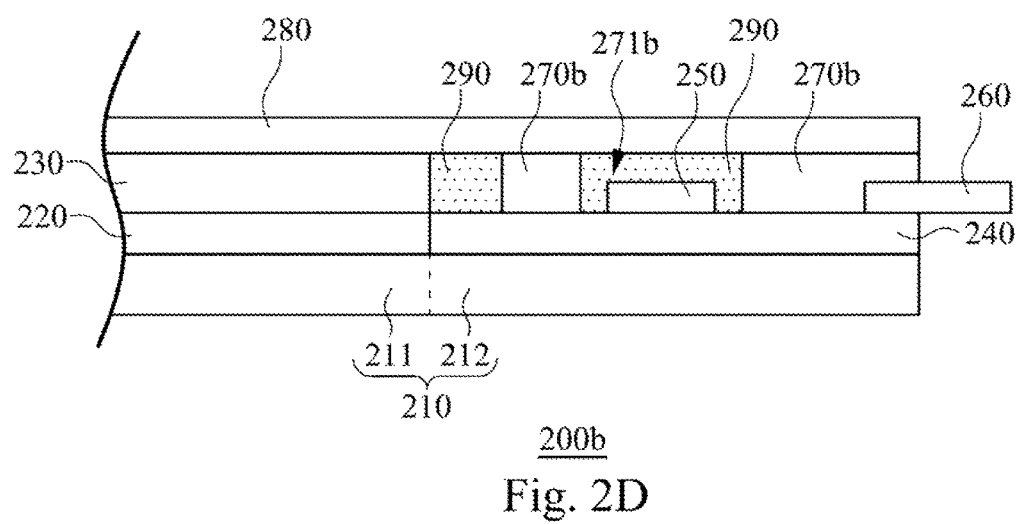
FIG. 2D is a sectional view of a circuit substrate structure 200b according to one embodiment of the present disclosure.

FIG. 2D is a sectional view of a circuit substrate structure 200b according to one embodiment of the present disclosure. In FIG. 2D, a flattening material layer 270b is positioned on the peripheral circuit layer 250, and the integrated circuit chip 250 is in a opening 271b. The flattening material layer 270b is not contacted with the display unit 230, and a sealant 290 is positioned between the flattening material layer 270b and the display unit 230. According to one example of the present disclosure, the sealant 290 is positioned between the flattening material layer and the display unit, and in the opening 291b of the flattening material layer 270b. According to one example of the present disclosure, the sealant 290 is heat curing adhesive, optical light-sensitive adhesive or after-light-sensitive heat curing adhesive. According to one example of the present disclosure, the flattening material layer 270b covers more than 50% of the non-display area 212 of the substrate 210.

According to one example of the present disclosure, the coefficient of linear thermal expansion of the flattening material layer 270a or 270b is less than $70 \times 10^{-6}$/K. According to one example of the present disclosure, the material of the flattening material layer 270a or 270b comprises glass, polyethylene terephthalate (PET), polyethylene naphthalene dicarboxylate (PEN), polymethyl methacrylate (PMMA), polycarbonate (PC), polystyrene (PS), or the combinations thereof. According to one example of the present disclosure, the thickness of the flattening material layer 270a or 270b is the same as the thickness of the display unit 230. According to one example of the present disclosure, the thickness of the flattening material layer 270a or 270b is larger than or equal to the integrated circuit chip 250.

Figure 3A:
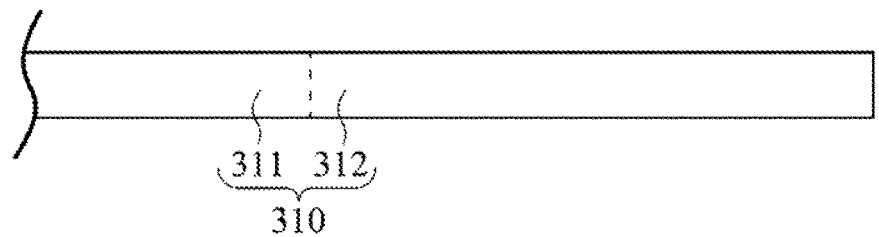
FIG. 3A to 3G are sectional views of making a circuit substrate structure 300a according to one embodiment of the present disclosure.
Figure 3B:
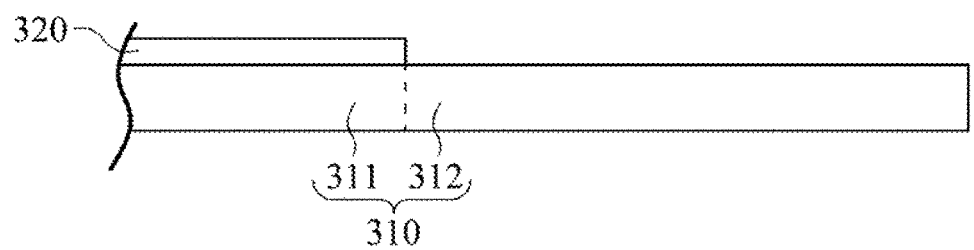
Figure 3C:
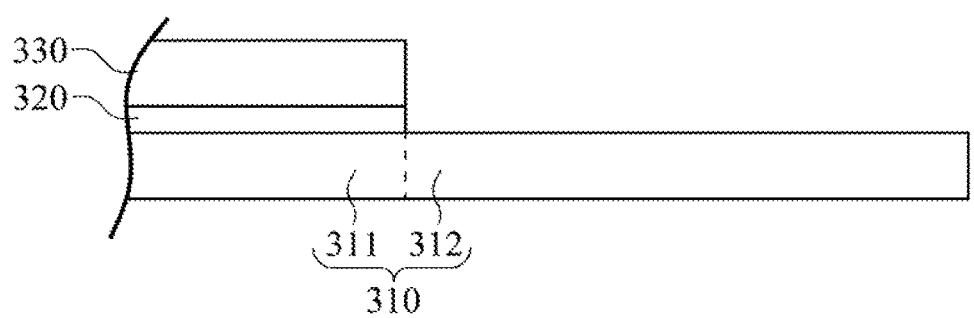

FIG. 3A to 3G are sectional views of making the circuit substrate structure 300a according to one embodiment of the present disclosure. In FIG. 3A, a substrate 310 is provided and has a display area 311 and a non-display area 312. Then, a pixel array layer 320 is formed on the display area 311 of the substrate 310, shown as FIG. 3B. In FIG. 3C, a display unit 330 is formed on the pixel array layer 320.

Figure 3D:
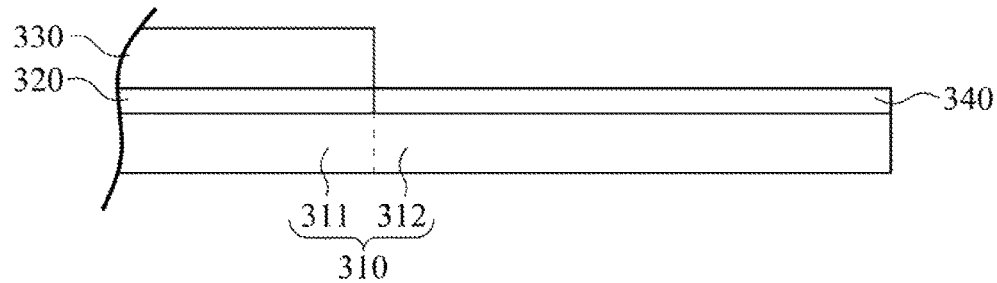
Figure 3E:
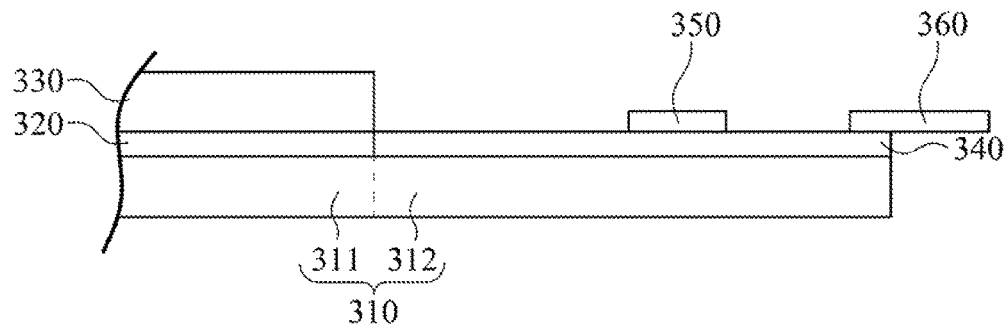

In FIG. 3D, a peripheral circuit layer 340 is formed on the non-display area 312 of the substrate 310, in which the peripheral circuit layer 340 is electrically connected to the pixel array layer 320. Then at east one integrated circuit chip 350 and a flexible printed circuit board 360 is formed on the peripheral circuit layer 340, shown as FIG. 3E.

Figure 3F:
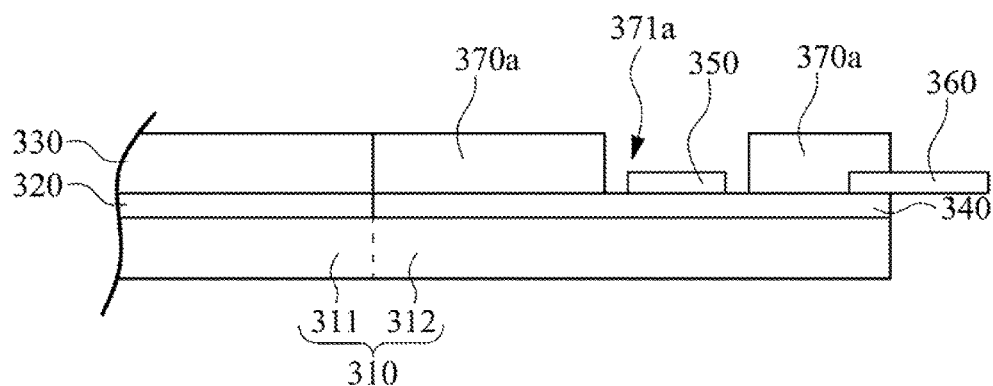

In FIG. 3F, a flattening material layer 370a is formed on the peripheral circuit layer 340 and contacted tightly with the neighboring display unit 330, and covers a portion of the flexible printed circuit board 360. The flattening material layer 370a has at least one opening 371a, and the opening 371a corresponds to and surrounds the integrated circuit chip 350. According to one example of the present disclosure, the flattening material layer 370a can be used to protect the integrated circuit chip 350.

Figure 3G:
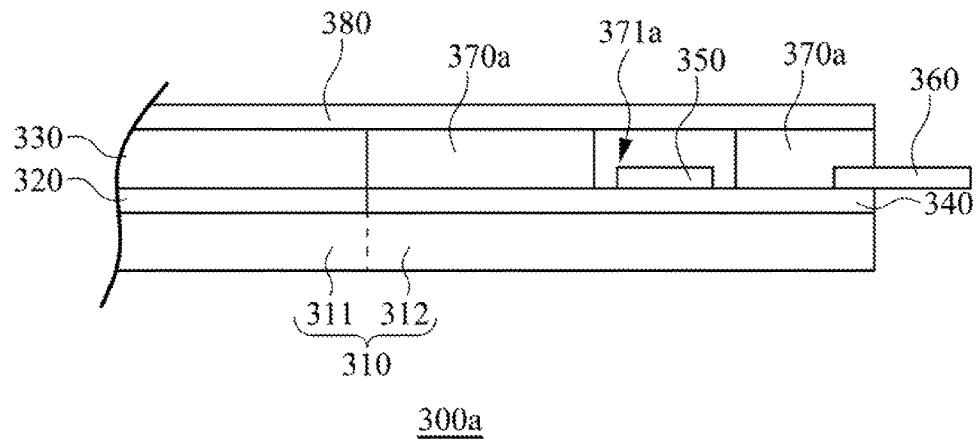

In FIG. 3G, a passivation layer 380 is formed on and covers the display unit 330 and the flattening material layer 370a, so as to form the circuit substrate structure 300a. Because the flattening material layer 370a is tightly contacted with the display unit 330 without a gap, there is no need to fill with a sealant. The passivation layer 380 can cover directly the display unit 330 and the flattening material layer 370a, and the circuit substrate structure 300a having flattening surface is provided. Thus, the step of optical or heat curing of the sealant is negligible, so as to reduce the manufacturing cost and prevent from the destruction of the heat treatment process on the display unit.

Noteworthy, because the flattening material layer 370a is tightly contacted with the display unit 330 without a gap, the circuit substrate structure 300a cannot occur the bubble issue as the prior art. According to one example of the present disclosure, the circuit substrate structure 300a can be applied to a display device.

Figure 3H:
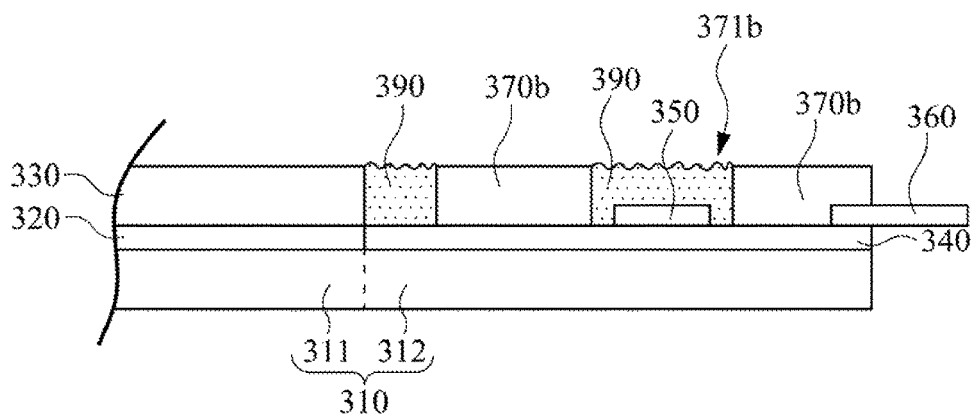
FIG. 3H to 3I are sectional views of making a circuit substrate structure 300b according to one embodiment of the present disclosure.
Figure 3I:
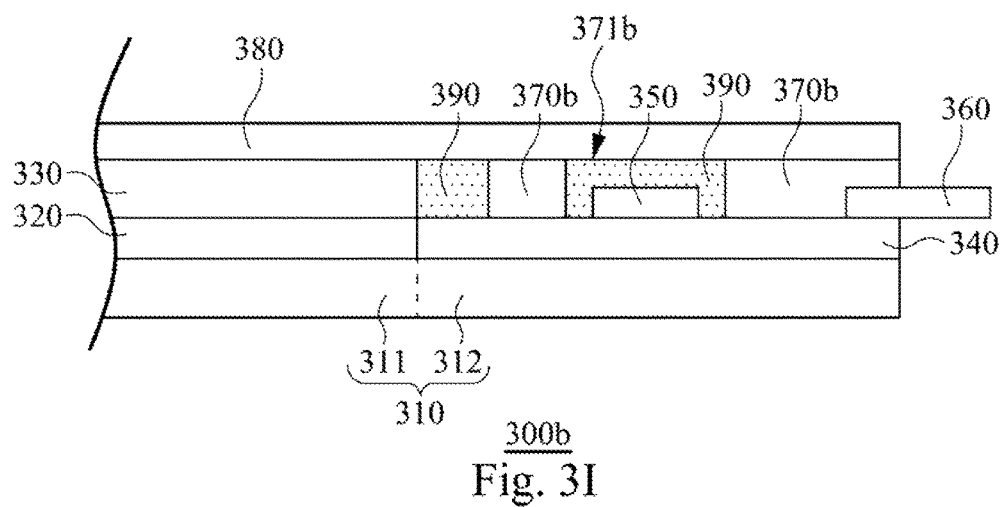

FIG. 3H to 3I are sectional views of making a circuit substrate structure 300b according to one embodiment of the present disclosure. FIG. 3H is followed by the structure shown in FIG. 3E. In FIG. 3H, a flattening material layer 370b is formed on the peripheral circuit layer 340, and covers a portion of the flexible printed circuit board 360. The flattening material layer 370b has at least one opening 371b, and the opening 371b corresponds to and surrounds the integrated circuit chip 350. A sealant 390 is formed between the flattening material layer 370b and the display unit 330, and in the opening 371b of the flattening material layer 370b. According to one example of the present disclosure, the sealant 390 is formed only between the flattening material layer 370b and the display unit 330. According to one example of the present disclosure, the flattening material layer 370b can be used to protect the integrated circuit chip 350.

In FIG. 3I, a passivation layer 380 is formed on and covers the display unit 330 and the flattening material layer 370b, so as to form the circuit substrate structure 300b. And then the circuit substrate structure 300b should be performed the optical or heat curing step of the sealant 390, so as to provide a circuit substrate structure 300b having flattening surface. According to one example of the present disclosure, the circuit substrate structure 300b can be applied to a display device.

Unlike to the traditional process, the method for manufacturing the circuit substrate structure 300b as one example of the present disclosure is firstly forming the sealant 390 between the flattening material layer 370b and the display unit 330, and then covering the passivation layer 380. This helps to avoid blind angle generated due to a height difference in the circuit substrate structure, and bubbles formed in the sealant filling. Besides, the method provided in the present disclosure can efficiently solve the bubble issue generated in the art.

It is noteworthy that the usage amount and area of the sealant, according to the embodiments of the present disclosure, can be significantly reduced by adding the flattening material layer into the circuit substrate structure, so as to achieve the purpose of flattening the surface of the circuit substrate structure. On the other hand, the method provided in the present disclosure can also solve the bubble issue generated in the circuit substrate structure. According to the example of the present disclosure, the steps of filling sealant and optical or heat curing can be completely omitted in the process of manufacturing the circuit substrate structure, so as to reduce the product cost and prevent the display device from the destruction after the heat-treatment.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A circuit substrate structure, comprising:
a substrate having a display area and a non-display area;
a pixel array layer positioned on the display area of the substrate;
a display unit positioned on the pixel array layer;
a peripheral circuit layer positioned on the non-display area of the substrate;
at least one integrated circuit chip positioned on the peripheral circuit layer;
a flexible printed circuit board positioned on the peripheral circuit layer;
at least one flattening material layer positioned on the peripheral circuit layer, and laterally adjacent to the display unit, and covering a portion of the flexible printed circuit board, the flattening material layer having at least one through hole having a depth equal to a thickness of the display unit, wherein the through hole accommodates and encircles the integrated circuit chip, and the integrated circuit chip is not in direct contact with the flattening material layer, and an edge of the flattening material layer adjacent to the display unit is aligned with an edge of the pixel array layer;
a passivation layer positioned on and covering the display unit and the flattening material layer;
a first sealant filling the through hole of the flattening material layer, wherein the first sealant comprises a material different from a material of the flattening material layer; and
a second sealant positioned between the display unit and the flattening material layer, wherein the second sealant has a thickness substantially the same as a thickness of the flattening material layer, and the second sealant comprises a material different from a material of the flattening material layer.

2. The circuit substrate structure of claim 1, wherein the second sealant is heat curing adhesive, optical light-sensitive adhesive or after-light-sensitive heat curing adhesive.

3. The circuit substrate structure of claim 1, wherein the flattening material layer covers more than 50% of the non-display area of the substrate.

4. The circuit substrate structure of claim 1, wherein the material of the substrate comprises glass, hard plastic or flexible plastic.

5. The circuit substrate structure of claim 1, wherein the peripheral circuit layer comprises a thin-film transistor layer or a conductive circuit layer.

6. The circuit substrate structure of claim 1, wherein the coefficient of linear thermal expansion of the flattening material layer is less than 70×10-6/K.

7. The circuit substrate structure of claim 1, wherein the thickness of the flattening material layer is the same as the thickness of the display unit.

8. The circuit substrate structure of claim 1, wherein the thickness of the flattening material layer is larger than or equal to the integrated circuit chip.

9. The circuit substrate structure of claim 1, wherein the flattening material layer comprises polyethylene terephthalate (PET), polyethylene naphthalene dicarboxylate (PEN), polymethyl methacrylate (PMMA), polycarbonate (PC), polystyrene (PS), or a combination thereof.

10. A method of manufacturing a circuit substrate structure used to a display, comprising the steps of:
providing a substrate having a display area and a non-display area,
forming a pixel array layer on the display area of the substrate,
forming a display unit on the pixel array layer,
forming a peripheral circuit layer on the non-display area,
forming at least one integrated circuit chip on the peripheral circuit layer,
forming a flexible printed circuit board on the peripheral circuit layer,
forming at least one flattening material layer on the peripheral circuit layer and laterally adjacent to the display unit and covering a portion of the flexible printed circuit board, wherein the flattening material layer has at least one through hole having a depth equal to a thickness of the display unit, wherein the through hole accommodates and encircles the integrated circuit chip, and the integrated circuit chip is not in direct contact with the flattening material layer, and an edge of the flattening material layer adjacent to the display unit is aligned with an edge of the pixel array layer;
forming a first sealant in the through hole of the flattening material layer, wherein the first sealant comprises a material different from a material of the flattening material layer;
forming a second sealant between the display unit and the flattening material layer, wherein the second sealant has a thickness substantially the same as a thickness of the flattening material layer, and the second sealant comprises a material different from a material of the flattening material layer; and forming a passivation layer on the display unit and the flattening material layer.

11. The method of claim 10, wherein the flattening material layer covers more than 50% of the non-display area of the substrate.

12. The method of claim 10, wherein the flattening material layer comprises polyethylene terephthalate (PET), polyethylene naphthalene dicarboxylate (PEN), polymethyl methacrylate (PMMA), polycarbonate (PC), polystyrene (PS), or a combination thereof.

* * * * *